United States Patent [19]

Bergström

[11] Patent Number: 4,629,884
[45] Date of Patent: Dec. 16, 1986

[54] ELECTROMAGNETIC RADIATION CIRCUIT ELEMENT INSENSITIVE TO EXTERNAL RADIATION

[76] Inventor: Arne Bergström, Drottninghamnsv. 72, 13146 Nacka, Sweden

[21] Appl. No.: 667,481
[22] PCT Filed: Feb. 1, 1984
[86] PCT No.: PCT/SE84/00031
 § 371 Date: Oct. 3, 1984
 § 102(e) Date: Oct. 3, 1984
[87] PCT Pub. No.: WO84/03186
 PCT Pub. Date: Aug. 16, 1984

[30] Foreign Application Priority Data

Feb. 3, 1983 [GB] United Kingdom ............... 8302997

[51] Int. Cl.⁴ .............................................. H01J 5/16
[52] U.S. Cl. ..................................... 250/227; 250/229; 340/365 P
[58] Field of Search ............................. 250/227, 229; 340/365 P; 350/96.1

[56] References Cited

U.S. PATENT DOCUMENTS 3,621,268 11/1971 Friedrich .................... 340/365 P
4,180,702 12/1979 Sick et al. .................... 250/227
4,254,333 3/1981 Bergstrom .................... 250/227
4,340,813 7/1982 Sauer .......................... 250/229
4,346,376 8/1982 Mallos ......................... 340/365 P

FOREIGN PATENT DOCUMENTS 1600556 10/1981 United Kingdom .

Primary Examiner—David C. Nelms
Assistant Examiner—James G. Gatto
Attorney, Agent, or Firm—Fisher, Christen & Sabol

[57] ABSTRACT

A touch-sensitive key has a radiation-propagating prism or plate between a radiation source and a radiation detector. Radiation is scattered from a top surface of the prism or plate so as to reach and activate the detector through a side surface when the top surface is touched. External radiation is free to enter the prism or plate and to leave through the side surface but this radiation is not capable of actuating the detector. In one embodiment the detector is spaced from the side surface so that it cannot be reached by external radiation. In an alternative embodiment, external radiation is subject to multiple reflections within the prism or plate and at each reflection part of the radiation is transmitted through the pertaining surface to be absorbed in a substrate layer.

8 Claims, 2 Drawing Figures

ELECTROMAGNETIC RADIATION CIRCUIT ELEMENT INSENSITIVE TO EXTERNAL RADIATION

FIELD OF THE INVENTION

This invention relates to electromagnetic radiation circuit elements generally of the touch-sensitive key tape.

BACKGROUND ART

British Pat. No. 1,600,556 relates to a touch-sensitive key having a radiation-propagating unit, such as an optical prism, arranged between a radiation source, such as a light-emitting diode, and a radiation detector such as a phototransistor. When an outer surface of the radiation-propagating unit is touched, the conditions for total internal reflection in this surface are changed, resulting in an identifiable change in the radiation from the radiation source which reaches the radiation detector. Incident external radiation does not reach the radiation detector because it is always internally reflected within the said unit so as to leave through a surface remote from the radiation detector.

This arrangement is generally satisfactory. However, practical problems can arise if the key is used with an optical system under water. The refractive index inside the radiation-propagating unit has to be above a certain critical value to ensure ray separation between detector rays (i.e. rays from the radiation source to the radiation detector) and external rays. This critical value is $1/\sqrt{2}$ where the medium outside the prism is air and about 1.66 where the medium is water. However, a refractive index of the order of 1.7 cannot be readily achieved with inexpensive materials such as ordinary glass or plexiglass, and expensive heavy optical glass may be necessary.

DISCLOSURE OF THE INVENTION

One object of the present invention is to overcome this problem.

According to one aspect of the present invention therefore there is provided an electromagnetic radiation circuit element comprising a radiation propagating unit between a radiation source and a radiation detector, said unit being adapted to produce an identifiable change in the radiation which reaches the detector from the radiation source when a surface of the unit is touched, characterised in that external radiation entering said unit through said surface can leave said unit at a side surface thereof but in a manner substantially insufficient to effect actuation of said detector thereby.

According to a second aspect of the present invention there is provided an electromagnetic radiation circuit element comprising a radiation-propagating unit between a radiation source and a radiation detector, said unit being adapted to produce an identifiable change in the radiation which reaches the detector from the radiation source when a surface of the unit is touched, characterised in that external radiation entering said unit through said surface is permitted to leave said unit at a side surface thereof but at a grazing angle which is substantially insufficient to enable said radiation to reach said detector.

Considering the case where the said surface is at right angles to opposed side surfaces through which the detector ray is arranged to pass between the radiation source and the radiation detector when the said surface is touched, the limiting case for the largest angle of an emerging ray at one said side surface derived from external radiation occurs when said external radiation is parallel to the said touching surface. If the external medium which interfaces with the touching surface has a refractive index $n_o$ and the said propagating unit has a refractive index $n$, then the largest angle $\phi$ which an ambient ray in the unit can have with the side surface is given by (cf Snell's Law):

$$\sin \phi = n_o/n.$$

Refracting this ray in the side surface, it will make an angle $\alpha$ with this surface, where $$\cos \alpha = \sqrt{n^2 - n_o^2}.$$

This means that at some distance from the side surface and outside certain sectors from this surface there will be no external rays (provided that the refracted rays can be prevented from reaching the detector by some kind of scattering in the neighbourhood of the detector). Inserting values, it will be seen that for a, say, 4 mm thick plate the distance between surface and detector need only be about 2 mm to ensure that no ambient light from outside the touch surface reaches the detector.

An effect closely relates to the grazing emergence of ambient rays at the side surface as described above can occur when moisture condenses on a radiation-propagating unit with low index of refraction such as glass or plexiglass. If the radiation source is placed under the glass the source rays will normally never be able to reach the detector unless the glass is touched by a finger or similar object, as is described in the prior Patent. However, due to the incomplete separation between the ray systems which is a consequence of the low refractive index of the radiation-propagating unit if inexpensive material is used in this unit, the source rays which are refracted by the touch surface at grazing angles may get deflected by the curved outer surface of moisture droplets on the touch surface back into the radiation-propagating unit within the angular domain where they could reach the detector.

If this effect is not remedied, moisture condensing on the touch surface might erroneously register as an actuation when inexpensive glass or plexiglass is used in the radiation-propagating unit. This problem can be overcome if the angular lobe of the radiation which reaches the glass from the radiation source is limited by means of an aperture so that substantially no source rays can reach droplets at grazing angles.

With the arrangements of the invention as described above, it is possible to achieve great operational touch sensitivity, with substantially no sensitivity to external radiation influences (ambient light), even in the case where the key is made of inexpensive glass or plexiglass and is used under water or other similar medium.

With the arrangement of the abovementioned prior Patent and also with the above second aspect of the invention, separation of unwanted external radiation from the detector ray is achieved by reliance on the angle of reflection and/or refraction of the external radiation at surfaces of the propagation unit as determined by the relative refractive indexes of the unit and the external medium. A further object of the present invention is to provide a touch-sensitive key which relies on an alternative mode of separation and which is particularly suitable for use where the external medium is water or the like, and which also permits the detector to be an integral part of the radiation-propagating unit (i.e. not separated from this unit by an air gap).

According to a third aspect of the present invention therefore there is provided an electromagnetic radiation circuit element comprising a radiation-propagating unit between a radiation source and a radiation detector, said unit being adapted to produce an identifiable change in the radiation which reaches the detector from the radiation source when a surface of the unit is touched, characterised in that at least one said surface of the said unit has a substrate thereon at least in the neighbourhood of the detector adapted to absorb or attenuate externally-derived radiation before it reaches the detector.

With this arrangement, allowance can be made for satisfactory elimination of said external radiation without necessarily requiring the use of expensive materials for the said propagation unit even possibly where the unit is used beneath water or other like medium.

Most preferably the said substrate is applied to the opposed surface parallel to the touching surface whereby the detector ray which is incident on the substrate surface at a grazing angle will be subjected to total internal reflection without essentially being affected by the said substrate, whereas externally-derived radiation which is directed at such surface at an angle which permits partial transmission therethrough will be severely absorbed or attenuated by the substrate.

The substrate may be of any suitable absorbing nature but preferably in the case of an optical system has a refractive index which is at least as large as that of the medium outside the said touching surface. However, the refractive index of the substrate should be as low as possible compared to the refractive index of the said propagation unit. In the case of an optical prism bounded by water the refractive index should be about 1.33.

The substrate may be in the form of an absorbing paint with the proper refractive index, which paint is applied on the surface of the plate, or it could be in the form of a second plate consisting of a material with the proper refractive index and incorporating absorbing means, which second plate is glued to the prism by transparent cement with high index of refraction, e.g. epoxy resin. The substrate could be combined with the method of attaching the plate to the apparatus in question, and/or the method of masking the detector from external light from above.

When a ray at a steep angle to the touch surface where only external rays occur, or a ray at an intermediate angle where external and internal rays both occur, encounters the interface between the prism and the substrate, it will partly be refracted into the substrate and absorbed there, and partly be reflected. If the substrate covers a sufficiently large area so that the rays have to perform a number of reflections in order to reach the detector, then the said rays will in this way be attenuated to very low levels. In contrast to this, the detector ray will experience total internal reflection in the interface and reach the detector without any refractive losses to the substrate, provided that the absorption in the substrate is low within the relaxation length of the evanescent wave at total internal reflection, so that the totally reflected wave will not be absorbed by tunnelling into the substrate.

With a modification of the above arrangement the absorbing material masking the detector may be separated from the prism by a gap with a medium with a refractive index essentially the same as the external medium. External rays reaching the detector normally undergo a series of multiple reflections in the prism surfaces, and at each reflection some of the rays is also refracted out through the surface and absorbed. If the absorbing material covers a sufficiently large area in front of the detector then, by these multiple reflections/refractions, rays originating from external sources will be attenuated to very low levels, whereas rays within the internal ray system will reach the detector without refractive losses since they are totally reflected in the surfaces.

BRIEF DESCRIPTION OF THE DRAWINGS

The accompanying drawings.

BEST MODE OF CARRYING OUT THE INVENTION

Figure 1:
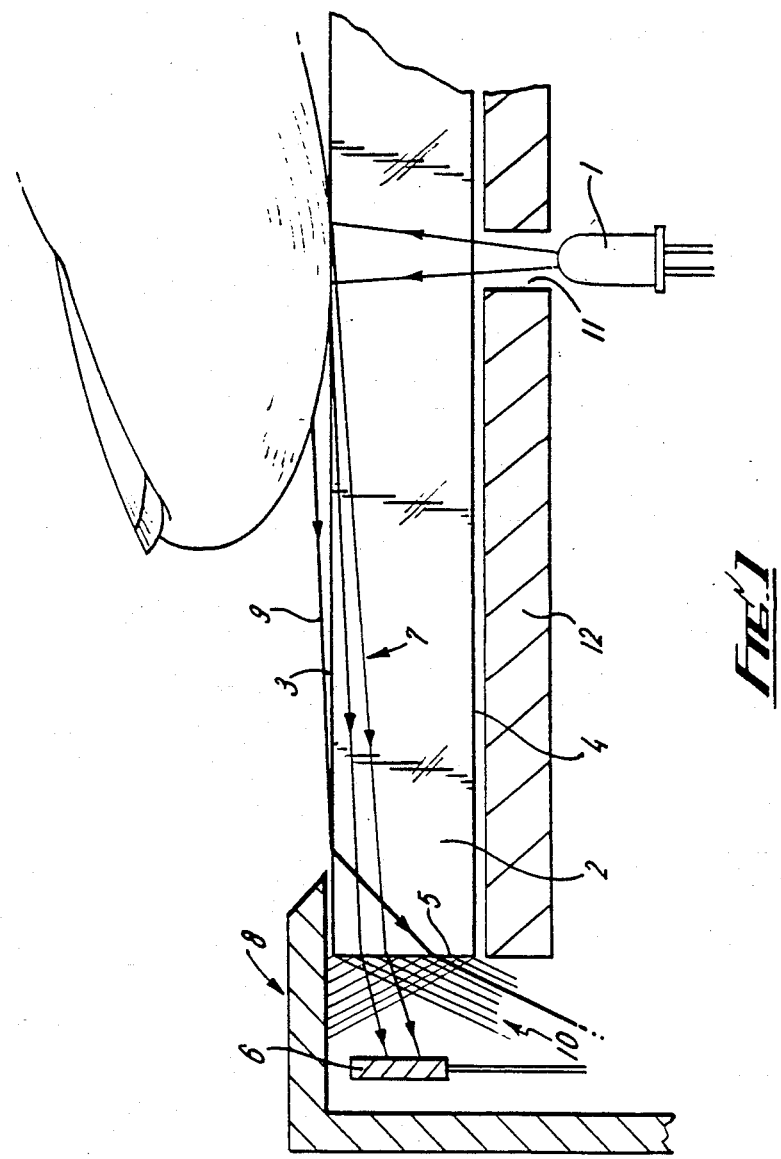
FIGS. 1 and 2, illustrate examples of the invention.

FIG. 1 shows an embodiment in which radiation sources, here exemplified by a light-emitting diode 1, are placed below a plexiglass plate 2 having a flat top surface 3, an opposed flat parallel bottom surface 4 and a side surface 5 between and at right angles to the surfaces 4, 5. If the top surface 3 of the plate 2 is touched by a finger, scattered radiation 7 is received by a detector 6 (such as a phototransistor) outside the side face 5 of the plate so that the detector 6 is actuated by this radiation. The detector 6 is spaced from and directly faces the side surface 5 and is located beneath a screening structure 8.

External rays, or rays from the light-emitting diodes when the finger is not in contact with the glass, will not reach the detector 6. Normally such rays will not even emerge from the side face 5 of the plate. However, the refractive index of plexiglass is not high enough to ensure total internal reflection of such rays in the side face 5 in the case where the external medium outside the touching surface 3 is water. In this case, though, the externally-derived rays 9 will exit from the side face at most with a certain largest grazing angle, as indicated by the shaded region 10 in FIG. 1. The detector 6 is placed at a suitable distance from the side face 5 so that the only radiation which reaches the detector is the radiation 7 scattered by the finger when this is in contact with the glass above the radiation source 1.

In order to eliminate possible problems due to refraction in moisture droplets as discussed above, the radiation from the light-emitting diode 1 is collimated by means of an aperture 11 in an opaque substrate 12.

Figure 2:
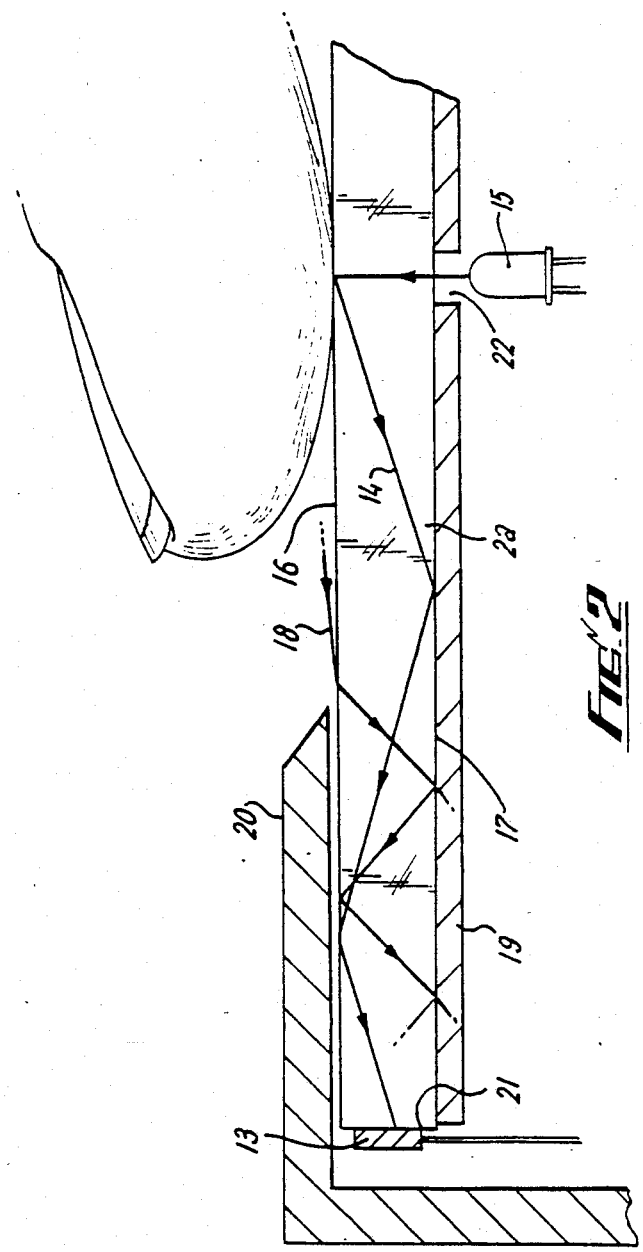

FIG. 2 shows a radiation-propagating unit in the form of a plate 2a (of like form to the plate 2) with a detector 13 integrated with the plate at a side surface 21 thereof. The detector ray 14, scattered by the finger from a radiation source 15 beneath the plate 2a, when the finger is in contact with the top surface 16 of the plate, is totally internally reflected by the top and bottom horizontal faces 16, 17 of the plate. External rays 18, on the other hand, are partly reflected and partly refracted at an interface between the bottom surface 17 and a substrate 19 applied thereto. The substrate 19 has an aperture 22 aligned with the source 15. Due to absorption of the refracted part, externally-derived radiation 18 is attenuated to low levels after a number of such partial reflections. The edge region of the top surface of the plate near to the detector is suitably shaded (with a screening structure 20) from direct external radiation, so that such radiation can reach the detector only after multiple reflections in the top and bottom faces 16, 17 of the plate.

It is of course to be understood that the invention is not intended to be restricted to the details of the above embodiments which are described by way of example only. In particular, the radiation source may instead be positioned to totally reflect radiation internally in the touch surface, which reflected radiation is attenuated when the finger is brought into contact with the surface.

Reference is made to U.S. Pat. No. 1,600,556 for further details where appropriate.

With the embodiments described above there is an identifiable change in the radiation from the radiation source which reaches the radiation detector when and only when the outer surface of the unit is touched, this change being due to changes in the conditions for total internal reflection in said surface. External radiation entering the unit through said surface does not essentially reach the radiation detector even in the case where the radiation-propagating unit is made of a material with a refractive index substantially the same as that of ordinary glass or plexiglass (e.g. less than 1.55) and the external medium has a refractive index substantially as that of water.

What is claimed is:

1. An electromagnetic radiation circuit element insensitive to external radiation comprising a radiation propagating unit having a touching surface and a further surface extending at a side of said touching surface, a radiation source arranged to direct radiation into said unit towards said touching surface and a radiation detector facing said side surface, an identifiable change being produced in the radiation which reaches the detector from the radiation source through changes in the conditions for total internal reflection in said touching surface when the touching surface of the unit is touched by an actuating object, wherein external radiation entering said unit through said touching surface can leave said unit at said side surface thereof but in a manner substantially insufficient to effect actuation of said detector thereby due to refraction of said external radiation at a surface of the radiation propagating unit.

2. An electromagnetic radiation circuit element insensitive to external radiation comprising a plate-shaped radiation propagating unit having a planar top surface which forms a touching surface, a planar bottom surface parallel to said top surface, and a side surface extending between and at right angles to said top and bottom surfaces at one side of the unit, said element further comprising a radiation detector located spaced an effective distance from and directly facing said side surface beneath a structure which screens said detector from external radiation, and a radiation source arranged beneath said bottom surface so as to direct radiation into said unit towards said touching surface, whereby an identifiable change is produced in the radiation which reaches the detector from the radiation source through changes in the conditions for the total internal reflection in said top surface when the touching surface of the unit is touched by an actuating object, wherein external radiation entering said unit through said touching surface can leave said unit at said side surface by reflection thereat but only at a grazing angle to said side surface which is substantially insufficient to enable said radiation to reach said detector.

3. An electromagnetic radiation circuit element insensitive to external radiation comprising a plate-shaped radiation propagating unit having a planar top surface which forms a touching surface, a planar bottom surface parallel to said top surface, and a side surface extending between and at right angles to said top and bottom surfaces at one side of the unit, said element further comprising a radiation detector facing said side surface beneath a structure which screens said detector from external radiation, and a radiation source arranged beneath said bottom surface so as to direct radiation into said unit towards said touching surface, whereby an identifiable change is produced in the radiation which reaches the detector from the radiation source through changes in the conditions for total internal reflection in said touching surface when the touching surface of the unit is touched by an actuating object, wherein the said bottom surface of said unit is in contact with a radiation-absorbing substrate at least in the neighborhood of the detector, and external radiation entering said unit through said touching surface can leave said unit at said side surface but only after partial refraction at said bottom surface and absorption or attenuation thereof by said substrate to an extent sufficient to prevent actuation of said detector thereby, whereas radiation reflected from the part of the actuating object in contact with the touching surface and incident on said bottom surface during propagation from said source to said detector is totally internally reflected at said bottom surface.

4. An element according to claim 3, wherein the said substrate is separated from the said unit by a gap containing a medium with a refractive index essentially the same as the external medium outside said touching surface.

5. An element according to claim 1, wherein a substrate is disposed between said radiation source and said unit and an aperture is provided in said substrate to restricted the spread of radiation passing from said source to said touching surface.

6. An element according to claim 5, wherein said substrate is an opaque substrate.

7. An element according to claim 1, insensitive to moisture droplets on said touching surface, wherein radiation from the radiation source is limited by means of an aperture so that substantially no source rays of said radiation can reach said droplets at grazing angles.

8. An element according to claim 3, wherein said detector is in contact with said side surface.

* * * * *